United States Patent
Nodo et al.

(10) Patent No.: US 11,890,753 B2
(45) Date of Patent: Feb. 6, 2024

(54) COOLING MEDIUM FLOW PATH STRUCTURE, COOLER, ROBOT, AND METHOD OF MOUNTING COOLER TO ROBOT

(71) Applicant: KAWASAKI JUKOGYO KABUSHIKI KAISHA, Kobe (JP)

(72) Inventors: Hiroaki Nodo, Kobe (JP); Ryoma Koretake, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 0 days.

(21) Appl. No.: 17/914,184

(22) PCT Filed: Mar. 16, 2021

(86) PCT No.: PCT/JP2021/010629
§ 371 (c)(1),
(2) Date: Feb. 3, 2023

(87) PCT Pub. No.: WO2021/193240
PCT Pub. Date: Sep. 30, 2021

(65) Prior Publication Data
US 2023/0202058 A1    Jun. 29, 2023

(30) Foreign Application Priority Data
Mar. 23, 2020  (JP) ................. 2020-051297

(51) Int. Cl.
*B25J 19/00*  (2006.01)
*B25J 9/10*  (2006.01)

(52) U.S. Cl.
CPC .......... *B25J 19/0054* (2013.01); *B25J 9/106* (2013.01)

(58) Field of Classification Search
CPC ........ B25J 9/106; B25J 19/0054; H02K 5/203
USPC ........................................... 310/54
See application file for complete search history.

(56) References Cited

U.S. PATENT DOCUMENTS

| | | | |
|---|---|---|---|
| 5,185,512 A * | 2/1993 | Torii | B23K 26/0884 219/121.84 |
| 2010/0007227 A1 * | 1/2010 | Smith | H02K 5/203 310/64 |
| 2013/0049495 A1 | 2/2013 | Matsuo | |
| 2014/0060231 A1 | 3/2014 | Watanabe | |
| 2015/0199376 A1 | 7/2015 | Matsuo | |

(Continued)

FOREIGN PATENT DOCUMENTS

| | | |
|---|---|---|
| JP | H09-323286 A | 12/1997 |
| JP | 2009-233824 A | 10/2009 |
| JP | 2011-182480 A | 9/2011 |

(Continued)

*Primary Examiner* — William C Joyce
(74) *Attorney, Agent, or Firm* — Oliff PLC

(57) ABSTRACT

A cooling medium flow path structure is for use at a joint of a robot. The joint of the robot includes an N-th link and an N+1-th link. A tubular projection extends from a first wall constituting the N-th link, and a motor is located on the first wall. The cooling medium flow path structure is annularly or tubularly shaped such that an inner peripheral surface of the cooling medium flow path structure is located outside an outer peripheral surface of the motor. The cooling medium flow path structure includes an internal cooling medium flow path through which a cooling medium flows.

13 Claims, 6 Drawing Sheets

(56) References Cited

U.S. PATENT DOCUMENTS

2016/0250759 A1     9/2016  Watanabe
2017/0368695 A1*  12/2017  Kohzaki .............. B25J 19/0054

FOREIGN PATENT DOCUMENTS

| JP | 2014-46398 A | 3/2014 |
| JP | 2015-6711 A | 1/2015 |
| JP | 2017-99281 A | 6/2017 |
| JP | 2018-126840 A | 8/2018 |
| JP | 2018-187710 A | 11/2018 |
| WO | WO 95/32842 * | 12/1995 |
| WO | 2019/003569 A1 | 1/2019 |

* cited by examiner

COOLING MEDIUM FLOW PATH STRUCTURE, COOLER, ROBOT, AND METHOD OF MOUNTING COOLER TO ROBOT

This is a U.S. National Phase Application of PCT/JP2021/010629 filed on Mar. 16, 2021. The disclosure of the prior application is hereby incorporated by reference herein in its entirety.

TECHNICAL FIELD

The present disclosure relates to a cooling medium flow path structure, a cooler, a robot, and a method of mounting a cooler to a robot.

BACKGROUND ART

An articulated robot is known which is adapted to efficiently cool a reduction gear (see Patent Literature 1, for example). In the articulated robot disclosed in Patent Literature 1, a cooling structure including an internal cooling water flow path is integrated with the reduction gear. The integrated cooling structure is alleged to accomplish effective cooling of the reduction gear.

CITATION LIST

Patent Literature

PTL 1: Japanese Laid-Open Patent Application Publication No. 2009-233824

SUMMARY OF INVENTION

Technical Problem

However, in the case where the cooling structure of the articulated robot of Patent Literature 1 is applied to an existing robot (e.g., a robot installed in a factory or any other facility), the worker needs to remove the reduction gear from the robot to cool the reduction gear. This leaves room for improvement in terms of work efficiency.

In the articulated robot of Patent Literature 1, the cooling structure integrated with the reduction gear is distant from the motor. Thus, the motor cannot be efficiently cooled by the cooling structure integrated with the reduction gear. To address this deficiency, the articulated robot of Patent Literature 1 includes another cooling structure mounted on the motor. This leads to an increased manufacturing cost of the robot.

The present disclosure is aimed at solving the above problems of the prior art, and an object of the present disclosure is to provide a cooling medium flow path structure, a cooler, a robot, and a method of mounting a cooler to a robot, which can reduce the burden on the worker and increase the efficiency in cooler mounting work and/or which can effect a reduction in manufacturing cost.

Solution to Problem

To solve the problems of the prior art, a cooling medium flow path structure according to the present disclosure is constructed as a cooling medium flow path structure for use at a joint of a robot, wherein the joint of the robot includes a first wall constituting an N-th link and a second wall constituting an N+1-th link, a motor is located on the first wall, the cooling medium flow path structure is annularly or tubularly shaped such that the cooling medium flow path structure is in contact with the first wall and that an inner peripheral surface of the cooling medium flow path structure is located outside an outer peripheral surface of the motor, and the cooling medium flow path structure includes an internal cooling medium flow path through which a cooling medium flows.

The cooling medium flow path structure as defined above can easily be mounted to an existing robot. This leads to a reduced burden on the worker and an increased efficiency in cooler (cooling medium flow path structure) mounting work.

As the cooling medium flow path structure is placed to surround the outer peripheral surface of the motor, the motor can be cooled efficiently. In the case where a reduction gear is located on the surface of the first wall that faces the N+1-th link, the reduction gear can be cooled efficiently through heat transfer from the first wall. As both the motor and the reduction gear can be cooled, the manufacturing cost can be lower than that required for the articulated robot of Patent Literature 1.

A cooler according to the present disclosure includes: the cooling medium flow path structure as defined above; a cooling medium circulation path connected to the cooling medium flow path structure; a radiator; a feeder; and a fan, wherein the radiator and the feeder are located in the cooling medium circulation path, and the fan cools the radiator with air.

The cooler as defined above can easily be mounted to an existing robot. This leads to a reduced burden on the worker and an increased efficiency in cooler mounting work.

As the cooling medium flow path structure is placed to surround the outer peripheral surface of the motor, the motor can be cooled efficiently. In the case where a reduction gear is located on the surface of the first wall that faces the N+1-th link, the reduction gear can be cooled efficiently through heat transfer from the first wall. As both the motor and the reduction gear can be cooled, the manufacturing cost can be lower than that required for the articulated robot of Patent Literature 1.

A robot according to the present disclosure includes the cooler as defined above.

As the cooling medium flow path structure is placed to surround the outer peripheral surface of the motor, the motor can be cooled efficiently. In the case where a reduction gear is located on the surface of the first wall that faces the N+1-th link, the reduction gear can be cooled efficiently through heat transfer from the first wall. As both the motor and the reduction gear can be cooled, the manufacturing cost can be lower than that required for the articulated robot of Patent Literature 1.

The present disclosure further provides a method of mounting a cooler to a robot, wherein a joint of the robot includes a first wall constituting an N-th link and a second wall constituting an N+1-th link, a tubular projection extends from a first wall surface of the first wall, the first wall surface facing the N-th link, a motor is located on the first wall surface and inside the projection, a reduction gear is located on a second wall surface of the first wall, the second wall surface facing the N+1-th link, the cooler includes: a cooling medium flow path structure that is annularly or tubularly shaped and that includes an internal cooling medium flow path through which a cooling medium flows; a cooling medium circulation path connected to the cooling medium flow path structure; a radiator; a feeder; a fan; and a support base, the radiator and the feeder are located in the cooling medium circulation path, and the fan cools the radiator with air, the method including: (A) mounting the radiator, the feeder, and the fan to the support base; (B) passing the motor through an inner cavity of the cooling medium flow path structure to bring the cooling medium flow path structure into contact with the first wall surface of the first wall; (C) mounting the support base with the radiator, the feeder, and the fan to a main body of the N-th link and/or the motor; and (D) connecting the cooling medium flow path structure, the radiator, and the feeder to one another through the cooling medium circulation path.

With this method, the cooler can easily be mounted to an existing robot. This leads to a reduced burden on the worker and an increased efficiency in cooler mounting work.

As the cooling medium flow path structure is placed to surround the outer peripheral surface of the motor, the motor can be cooled efficiently. Additionally, the reduction gear is located on that surface of the first wall which faces the N+1-th link, and thus the reduction gear can be cooled efficiently through heat transfer from the first wall. As both the motor and the reduction gear can be cooled, the manufacturing cost can be lower than that required for the articulated robot of Patent Literature 1.

The present disclosure further provides another method of mounting a cooler to a robot, wherein a joint of the robot includes a first wall constituting an N-th link and a second wall constituting an N+1-th link, a tubular projection extends from a first wall surface of the first wall, the first wall surface facing the N-th link, a motor is located on the first wall surface and inside the projection, a reduction gear is located on a second wall surface of the first wall, the second wall surface facing the N+1-th link, the cooler includes: a cooling medium flow path structure that is annularly or tubularly shaped and that includes an internal cooling medium flow path through which a cooling medium flows; a cooling medium circulation path connected to the cooling medium flow path structure; a radiator; a feeder; a fan; and a support base, the radiator and the feeder are located in the cooling medium circulation path, and the fan cools the radiator with air, the method including: (E) passing the motor through an inner cavity of the cooling medium flow path structure to bring the cooling medium flow path structure into contact with the first wall surface of the first wall; (F) mounting the support base to a main body of the N-th link and/or the motor; (G) mounting the radiator, the feeder, and the fan to the support base; and (H) connecting the cooling medium flow path structure, the radiator, and the feeder to one another through the cooling medium circulation path.

With this method, the cooler can easily be mounted to an existing robot. This leads to a reduced burden on the worker and an increased efficiency in cooler mounting work.

As the cooling medium flow path structure is placed to surround the outer peripheral surface of the motor, the motor can be cooled efficiently. Additionally, the reduction gear is located on that surface of the first wall which faces the N+1-th link, and thus the reduction gear can be cooled efficiently through heat transfer from the first wall. As both the motor and the reduction gear can be cooled, the manufacturing cost can be lower than that required for the articulated robot of Patent Literature 1.

The above and further objects, features and advantages of the present disclosure will be more apparent from the following detailed description of preferred embodiments with reference to the accompanying drawings.

Advantageous Effects of Invention

The cooling medium flow path structure, the cooler, the robot, and the method of mounting a cooler to a robot according to the present disclosure can reduce the burden on the worker and increase the efficiency in cooler mounting work and/or can effect a reduction in manufacturing cost.

DESCRIPTION OF EMBODIMENTS

Figure 1:
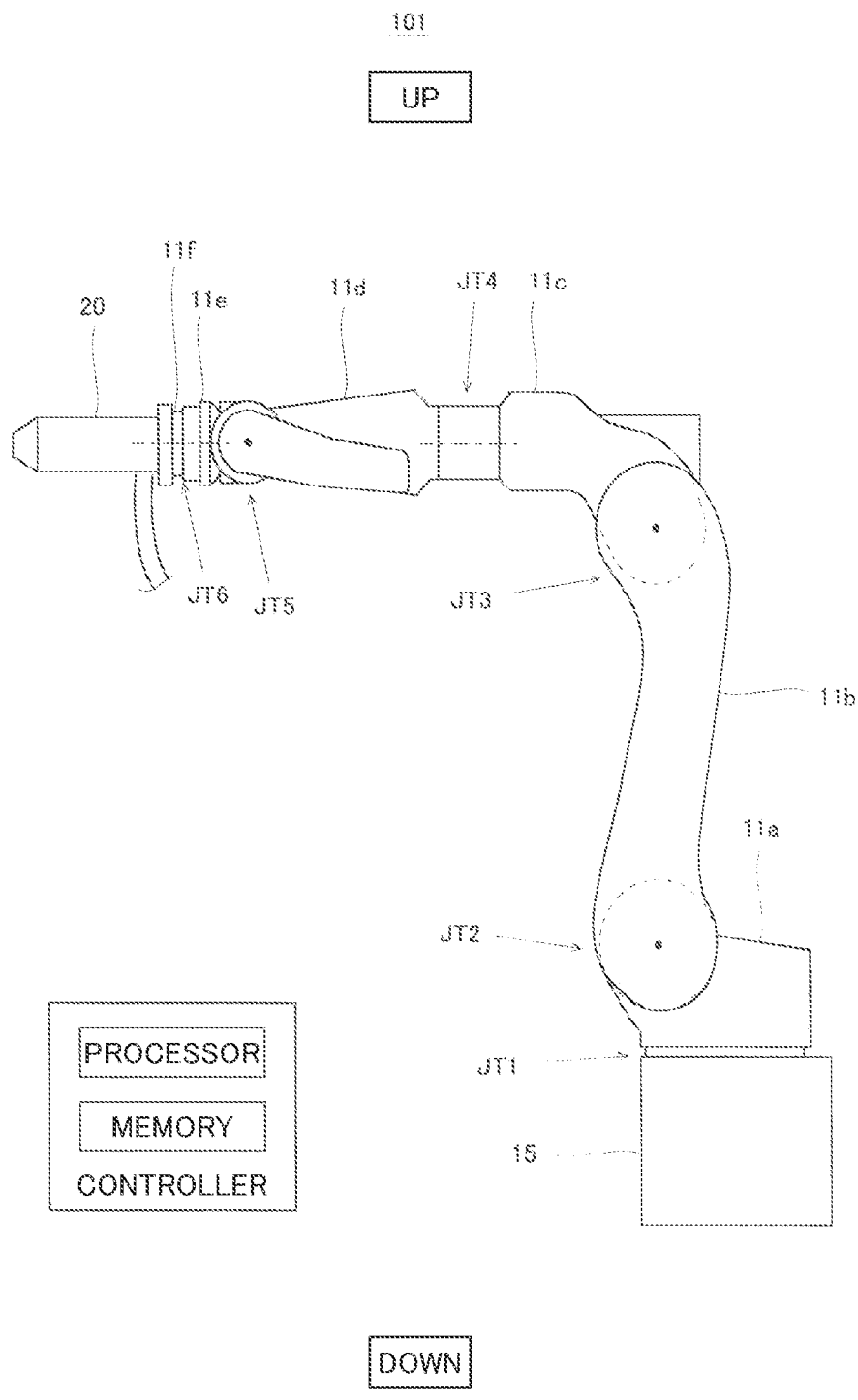
FIG. 1 is a schematic view showing a schematic configuration of a robot according to Embodiment 1.

Hereinafter, exemplary embodiments of the present disclosure will be described with reference to the drawings. The same or like elements are denoted by the same reference signs throughout the drawings and will not be described repeatedly. In all of the drawings, some elements are selectively depicted to illustrate the present disclosure, and the other elements may be omitted. The present disclosure is not limited to the embodiments described below.

Embodiment 1

A cooling medium flow path structure according to Embodiment 1 is a cooling medium flow path structure for use at a joint of a robot, wherein the joint of the robot includes a first wall constituting an N-th link and a second wall constituting an N+1-th link, a motor is located on the first wall, the cooling medium flow path structure is annularly or tubularly shaped such that the cooling medium flow path structure is in contact with the first wall and that an inner peripheral surface of the cooling medium flow path structure is located outside an outer peripheral surface of the motor, and the cooling medium flow path structure includes an internal cooling medium flow path through which a cooling medium flows.

N is a natural number other than zero.

In the cooling medium flow path structure according to Embodiment 1, a projection may extend from the first wall, the motor may be located inside the projection, and an outer peripheral surface of the cooling medium flow path structure may be located inside an inner peripheral surface of the projection.

In the cooling medium flow path structure according to Embodiment 1, the projection may be tubular.

In the cooling medium flow path structure according to Embodiment 1, the cooling medium may be water or antifreeze.

A cooler according to Embodiment 1 includes: the cooling medium flow path structure; a cooling medium circulation path connected to the cooling medium flow path structure; a radiator; a feeder; and a fan, wherein the radiator and the feeder are located in the cooling medium circulation path, and the fan cools the radiator with air.

In the cooler according to Embodiment 1, the radiator, the feeder, and the fan may be located on a support base.

In the cooler according to Embodiment 1, a motor may be located on the first wall, and the support base may be mounted on the motor.

A robot according to Embodiment 1 includes the cooler.

The robot according to Embodiment 1 may be a multi-axis vertical robot including joints, an axle of one of the joints that is closest to a proximal end of the robot may be a first axle, and the cooler is located on at least one of the first axle, a second axle, and a third axle of the robot.

In the robot according to Embodiment 1, the motor may be mounted on a first wall surface of the first wall, the first wall surface facing the N-th link. A reduction gear may be located on a second wall surface of the first wall, the second wall surface facing the N+1-th link. The cooling medium flow path structure may be located on the first wall surface and surround the motor.

In the robot according to Embodiment 1, a heat-transfer material may be located between the cooling medium flow path structure and the first wall surface.

In the robot according to Embodiment 1, the cooling medium circulation path may be located in the N-th link.

A method of mounting a cooler to a robot according to Embodiment 1 is a method of mounting a cooler for use at a joint of the robot, wherein the joint of the robot includes a first wall constituting an N-th link and a second wall constituting an N+1-th link, a tubular projection extends from a first wall surface of the first wall, the first wall surface facing the N-th link, a motor is located on the first wall surface and inside the projection, a reduction gear is located on a second wall surface of the first wall, the second wall surface facing the N+1-th link, the cooler includes: a cooling medium flow path structure that is annularly or tubularly shaped and that includes an internal cooling medium flow path through which a cooling medium flows; a cooling medium circulation path connected to the cooling medium flow path structure; a radiator; a feeder; a fan; and a support base, the radiator and the feeder are located in the cooling medium circulation path, and the fan cools the radiator with air, the method including: (A) mounting the radiator, the feeder, and the fan to the support base; (B) passing the motor through an inner cavity of the cooling medium flow path structure to bring the cooling medium flow path structure into contact with the first wall surface of the first wall; (C) mounting the support base with the radiator, the feeder, and the fan to a main body of the N-th link and/or the motor; and (D) connecting the cooling medium flow path structure, the radiator, and the feeder to one another through the cooling medium circulation path.

Hereinafter, an example of the robot according to Embodiment 1 will be described with reference to FIGS. 1 to 4.

Configuration of Robot

FIG. 1 is a schematic view showing a schematic configuration of the robot according to Embodiment 1. The up-down direction indicated in FIG. 1 is that defined with respect to the robot.

As shown in FIG. 1, the robot 101 according to Embodiment 1 is a vertical articulated robot arm including a series of coupled links (first to sixth links 11a to 11f), joints (first to sixth joints JT1 to JT6), a support base 15 supporting the links and joints, and a controller 111.

In Embodiment 1, a six-axis vertical articulated robot is employed as the robot 101. The robot 101 is not limited to the six-axis vertical articulated robot and may be any type of vertical articulated robot such as a seven-axis vertical articulated robot.

The first joint JT1 couples the support base 15 and the proximal end of the first link 11a in a manner permitting rotation about a vertically extending axis. The second joint JT2 couples the distal end of the first link 11a and the proximal end of the second link 11b in a manner permitting rotation about a horizontally extending axis. The third joint JT3 couples the distal end of the second link 11b and the proximal end of the third link 11c in a manner permitting rotation about a horizontally extending axis.

The fourth joint JT4 couples the distal end of the third link 11c and the proximal end of the fourth link 11d in a manner permitting rotation about an axis extending along the length of the fourth link 11d. The fifth joint JT5 couples the distal end of the fourth link 11d and the proximal end of the fifth link 11e in a manner permitting rotation about an axis perpendicular to the length of the fourth link 11d. The sixth joint JT6 couples the distal end of the fifth link 11e and the proximal end of the sixth link 11f in a manner permitting torsional rotation.

A mechanical interface is located at the distal end of the sixth link 11f. An end effector 20 adapted for the intended work is removably mounted on the mechanical interface.

Figure 2:
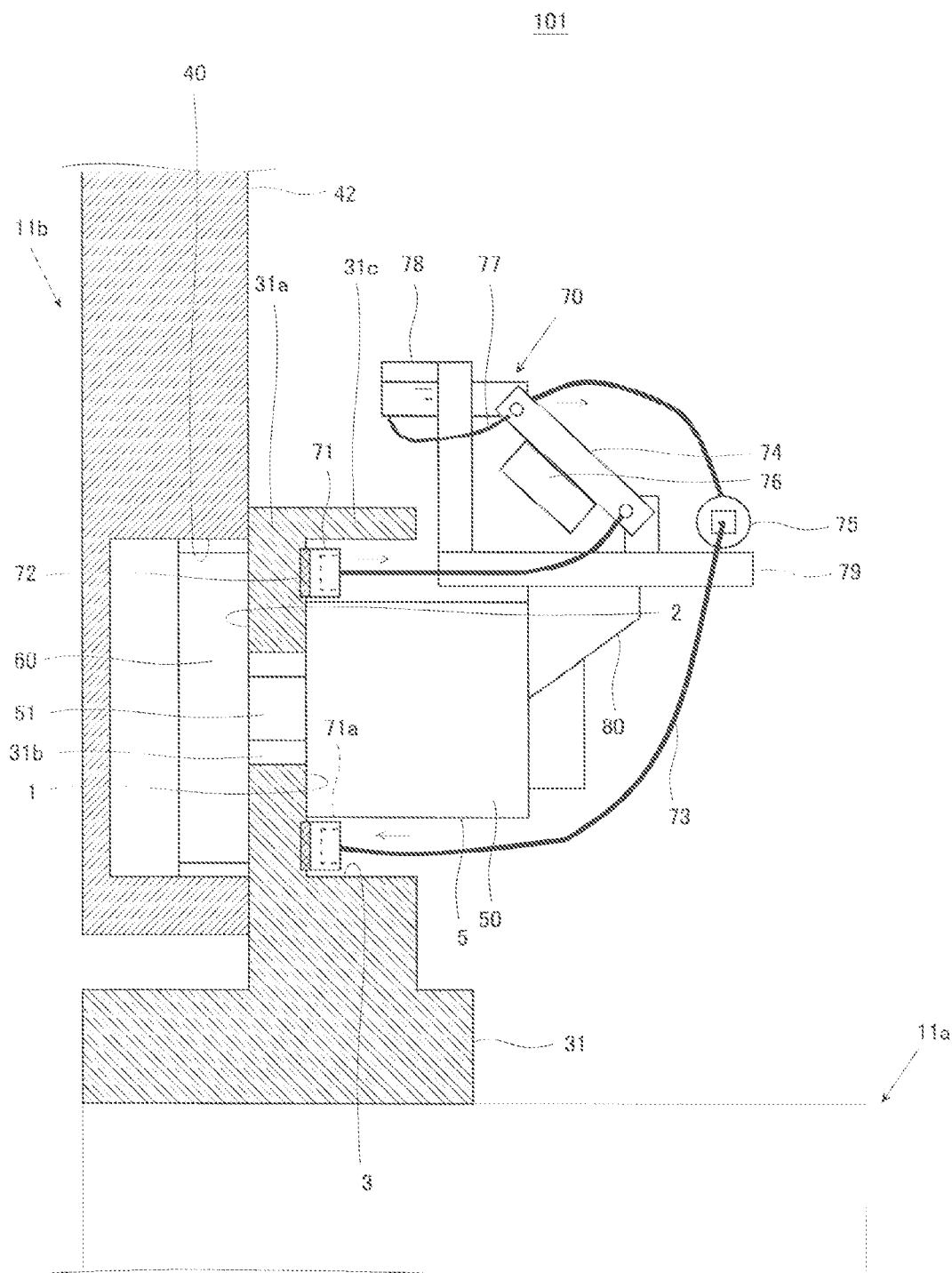
FIG. 2 is a schematic view showing a schematic configuration of a joint (second joint) of the robot of FIG. 1.

Each of the first to sixth joints JT1 to JT6 is equipped with a motor, which is an example of an actuator for effecting relative rotation between the two components coupled by the joint (see FIG. 2). The motor may be, for example, a servomotor servo-controlled by the controller 111. Each of the first to sixth joints JT1 to JT6 is equipped with a rotational sensor (not shown) for detecting the rotational position of the drive motor and a current sensor for detecting an electric current for control of the rotation of the drive motor. The rotational sensor may be, for example, an encoder.

The controller 111 is located outside the support base 15 (robot 101). The controller 111 may be located within the support base 15 (robot 101). The controller 111 includes a processor 111a such as a microprocessor or CPU and a memory 111b such as a ROM or RAM. The memory 111b pre-stores information such as a basic program and various fixed data.

The processor 111a is configured to retrieve software such as the basic program from the memory 111b and execute the software to allow the robot 101 to perform various motions.

The controller 111 may be configured to control a feeder 75 and/or fan 76 of a cooler 70 described later. In this case, the controller 111 may control the feeder 75 and/or fan 76 to increase or decrease the current flowing through the motor located at each of the joints.

Specifically, when increasing the current flowing through the motor, the controller 111 may control the feeder 75 to increase the feed amount and/or control the fan 76 to increase the amount of operation (rotational speed) of the fan. When decreasing the current flowing through the motor, the controller 111 may control the feeder 75 to decrease the feed amount and/or control the fan 76 to decrease the amount of operation (rotational speed) of the fan.

The controller 111 may consist of a single controller that performs centralized control or may be constituted by two or more controllers cooperative with one another to achieve distributed control. The controller 111 may be embodied, for example, by a microcomputer, an MPU, a PLC (Programmable Logic Controller), or a logic circuit.

Construction of Cooler

Next, a cooler for use at a joint of the robot 101 according to Embodiment 1 will be described with reference to FIGS. 2 and 3.

FIG. 2 is a schematic view showing a schematic configuration of a joint (second joint JT2) of the robot of FIG. 1.

As shown in FIG. 2, the second joint JT2 couples the first link 11a and the second link 11b. The first link 11a includes a main body 31. The main body 31 includes a plate-shaped first wall 31a. The second link 11b includes a second wall 42.

The first wall 31a includes a through hole 31b. The main body 31 is disposed such that the through hole 31b is in communication with a recess 40 of the second link 11b. In the following description, one surface of the first wall 31a that faces the second link 11b will be referred to as a "second wall surface 2", and the other surface opposite the second wall surface 2 (surface facing the first link 11a) will be referred to as a "first wall surface 1".

A tubular projection 31c extends from the first wall surface 1 of the first wall 31a. A motor 50 is mounted on the first wall surface 1 in such a manner that the motor 50 is located inside the projection 31c and that an output shaft 51 of the motor 50 extends through the through hole 31b. A reduction gear 60 is located in the recess 40 and connected to the output shaft 51 of the motor 50. The reduction gear 60 is connected also to the second link 11b. Any of various known reduction gears can be used as the reduction gear 60.

Thus, the second link 11b can pivot relative to the first link 11a in response to rotation of the motor 50.

Additionally, a cooling medium flow path structure 71 according to Embodiment 1 is located on the first wall surface 1 and surrounds an outer peripheral surface 5 of the motor 50. A heat-transfer material 72 may be located between the first wall surface 1 and the cooling medium flow path structure 71. The heat-transfer material 72 may be, for example, heat-release grease (thermally conductive grease) or silicone for heat release.

The configuration of the cooling medium flow path structure 71 will now be described with reference to FIGS. 2 and 3.

Figure 3:
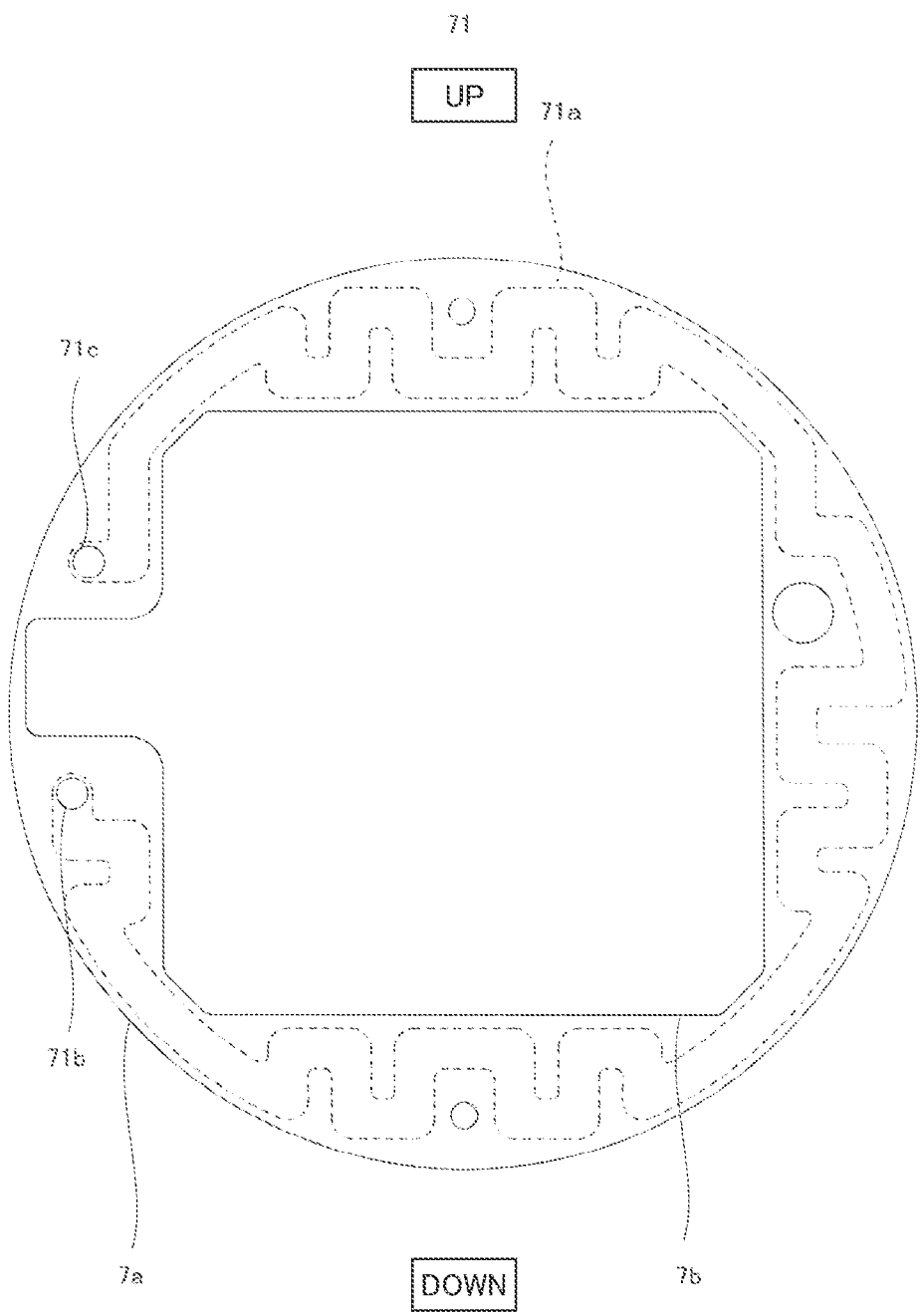
FIG. 3 is a schematic view showing a schematic configuration of a cooling medium flow path structure of a cooler of FIG. 2.

FIG. 3 is a schematic view showing a schematic configuration of the cooling medium flow path structure of the cooler of FIG. 2. The up-down direction indicated in FIG. 3 is that defined with respect to the cooling medium flow path structure.

As shown in FIGS. 2 and 3, the cooling medium flow path structure 71 is annularly or tubularly shaped. The cooling medium flow path structure 71 is constructed such that an outer peripheral surface 7a of the cooling medium flow path structure 71 is located inside an inner peripheral surface 3 of the projection 31c and that an inner peripheral surface 7b of the cooling medium flow path structure 71 is located outside the outer peripheral surface 5 of the motor 50.

Thus, the worker can easily place the cooling medium flow path structure 71 into a tubular space defined between the projection 31c and the motor 50.

The cooling medium flow path structure 71 includes an internal cooling medium flow path 71a. The cooling medium flow path 71a as viewed along the axis of the output shaft 51 of the motor 50 is generally C-shaped (extends generally over the entire circumference of the cooling medium flow path structure 71). The cooling medium flow path 71a meanders through a region between the outer peripheral surface 7a and the inner peripheral surface 7b.

One end of the cooling medium flow path 71a (lower end in FIG. 3) serves as an inlet (supply port) 71b for the cooling medium, and the other end of the cooling medium flow path 71a (upper end in FIG. 3) serves as an outlet (discharge port) 71c for the cooling medium. The inlet 71b and the outlet 71c are connected to each other through the cooling medium circulation path 73.

The cooling medium flowing through the cooling medium flow path 71a and the cooling medium circulation path 73 may be, for example, water, an aqueous solution, or antifreeze such as ethylene glycol, glycerin, or long-life coolant (LLC).

A radiator 74 and feeder (pump) 75 are located in the cooling medium circulation path 73. The radiator 74 is equipped with a fan 76 for cooling the radiator 74. A tank 78 may be connected to the radiator 74 through a first flow path 77.

To downsize the cooler 70, the feeder 75 may be located downstream of the radiator 74. To increase the cooling efficiency of the cooler 70, the feeder 75 may be located upstream of the radiator 74.

The radiator 74, feeder 75, and tank 78 are mounted on a generally L-shaped support base 79. The support base 79 is connected (secured) to a flange 80 mounted on the motor 50.

Method of Mounting Cooler

Hereinafter, a method of mounting the cooler 70 according to Embodiment 1 will be described in detail with reference to FIGS. 1 to 4. The procedures described below are performed by the worker. The worker may perform the procedures by operating a robot other than the robot 101 to which the cooler 70 is mounted.

Figure 4:
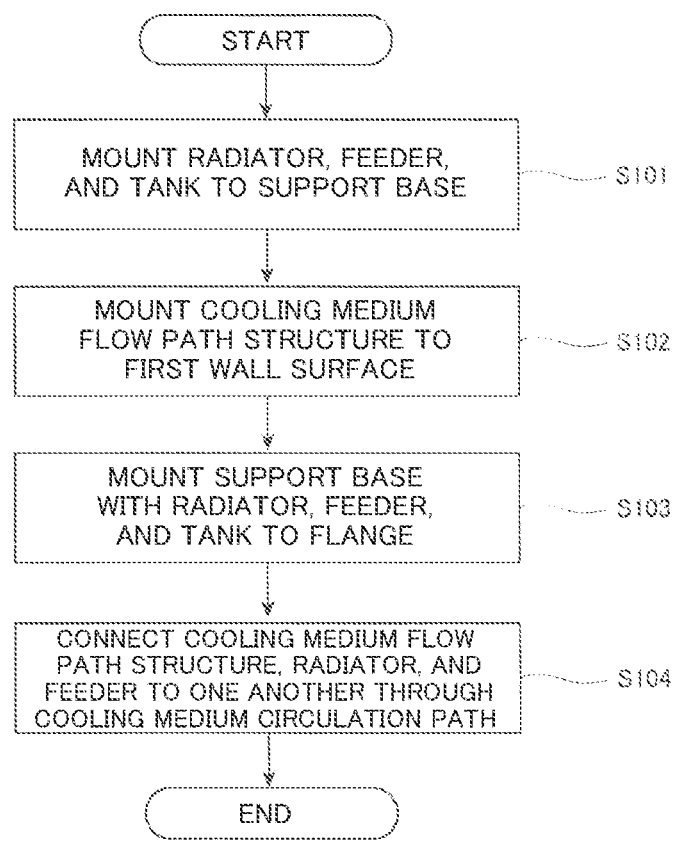
FIG. 4 is a flowchart illustrating an example of a method of mounting the cooler according to Embodiment 1.

FIG. 4 is a flowchart illustrating an example of the method of mounting the cooler according to Embodiment 1.

There is assumed a robot installed in an existing facility and not equipped with the cooler 70 according to Embodiment 1. The following describes the procedures for mounting the cooler 70 to the robot.

As shown in FIG. 4, the worker mounts the radiator 74, feeder 75, and tank 78 to the support base 79 (step S101).

Next, the worker mounts the cooling medium flow path structure 71 to the first wall surface 1 of the first wall 31a (step S102). Specifically, the worker moves the cooling medium flow path structure 71 to pass the motor 50 through the inner cavity of the cooling medium flow path structure 71, and brings the cooling medium flow path structure 71 into contact with the first wall surface 1 of the first wall 31a. The worker then mounts (secures) the cooling medium flow path structure 71 to the first wall surface 1 by any suitable means (e.g., bolts). The worker may place the heat-transfer material 72 on that surface of the cooling medium flow path structure 71 which is brought into contact with the first wall surface 1 and/or on that portion of the first wall surface 1 with which the cooling medium flow path structure 71 is brought into contact.

Steps S101 and S102 may be performed in reverse order.

Next, the worker mounts to the flange 80 the support base 79 to which the radiator 74, feeder 75, and tank 78 have been mounted in step S101 (step S103). Subsequently, the worker connects the cooling medium flow path structure 71 (the inlet 71b and outlet 71c of the cooling medium flow path 71a), the radiator 74, and the feeder 75 to one another using pipes constituting the cooling medium circulation path 73 (step S104). The worker connects the tank 78 and the radiator 74 to each other using pipes constituting the first flow path 77. Finally, the worker charges the tank 78 with the cooling medium, thus completing the mounting of the cooler 70 to the robot 101.

The cooling medium flow path structure 71 according to Embodiment 1 is tubularly or annularly shaped. Thus, the cooling medium flow path structure 71 can be mounted to the first wall surface 1 of the first wall 31a simply by passing the motor 50 through the inner cavity of the cooling medium flow path structure 71.

The cooling medium flow path structure 71 (cooler 70) according to Embodiment 1 can be mounted to a joint without having to remove any component other than a cover 32. That is, it is unnecessary to remove (disassemble) the N-th link (the main body 31 of the first link 11a) and the N+1-th link in order to mount the cooling medium flow path structure 71 (cooler 70) to the joint.

Thus, the worker can easily mount the cooling medium flow path structure 71 (cooler 70) to an existing robot (e.g., a robot installed in a factory or any other facility).

Being located outside the motor 50, the cooling medium flow path structure 71 according to Embodiment 1 can cool the motor 50. As the reduction gear 60 is in contact with the second wall surface 2 of the first wall 31a, the cooling medium flow path structure 71 can cool the reduction gear 60 as well through heat transfer from the first wall 31a.

Thus, the use of the cooling medium flow path structure 71 (cooler 70) according to Embodiment 1 can reduce the manufacturing cost, as compared with the use of the articulated robot of Patent Literature 1 which requires different cooling structures for cooling the motor 50 and the reduction gear 60, respectively.

The cooler 70 according to Embodiment 1 includes the radiator 74 for cooling the heated cooling medium, and the flow paths (cooling medium flow path 71a and cooling medium circulation path 73) form a circulation loop in the joint of the robot 101.

This eliminates the need for a cooling medium flow path (pipe) located outside the robot 101, allowing for downsizing of the robot 101 and making it easier to mount the cooler 70 to an existing robot.

That is, the cooler 70 can be mounted to the robot 101 without having to prepare a pipe and/or a cooling medium storage tank as additional factory equipment. This can reduce the cost required for mounting of the cooler 70 to the robot 101.

As such, the robot 101 including the cooling medium flow path structure 71 (cooler 70) according to Embodiment 1 exhibits a higher cooling efficiency and requires a lower manufacturing cost than the articulated robot of Patent Literature 1.

The robot 101 according to Embodiment 1 may include a cover covering the cooler 70.

Variant 1

In a cooler of Variant 1 of Embodiment 1, the motor is located on the first wall of the N-th link, and the support base is mounted on the N-th link.

Hereinafter, an example of a robot (cooler) of Variant 1 of Embodiment 1 will be described with reference to FIG. 5.

Figure 5:
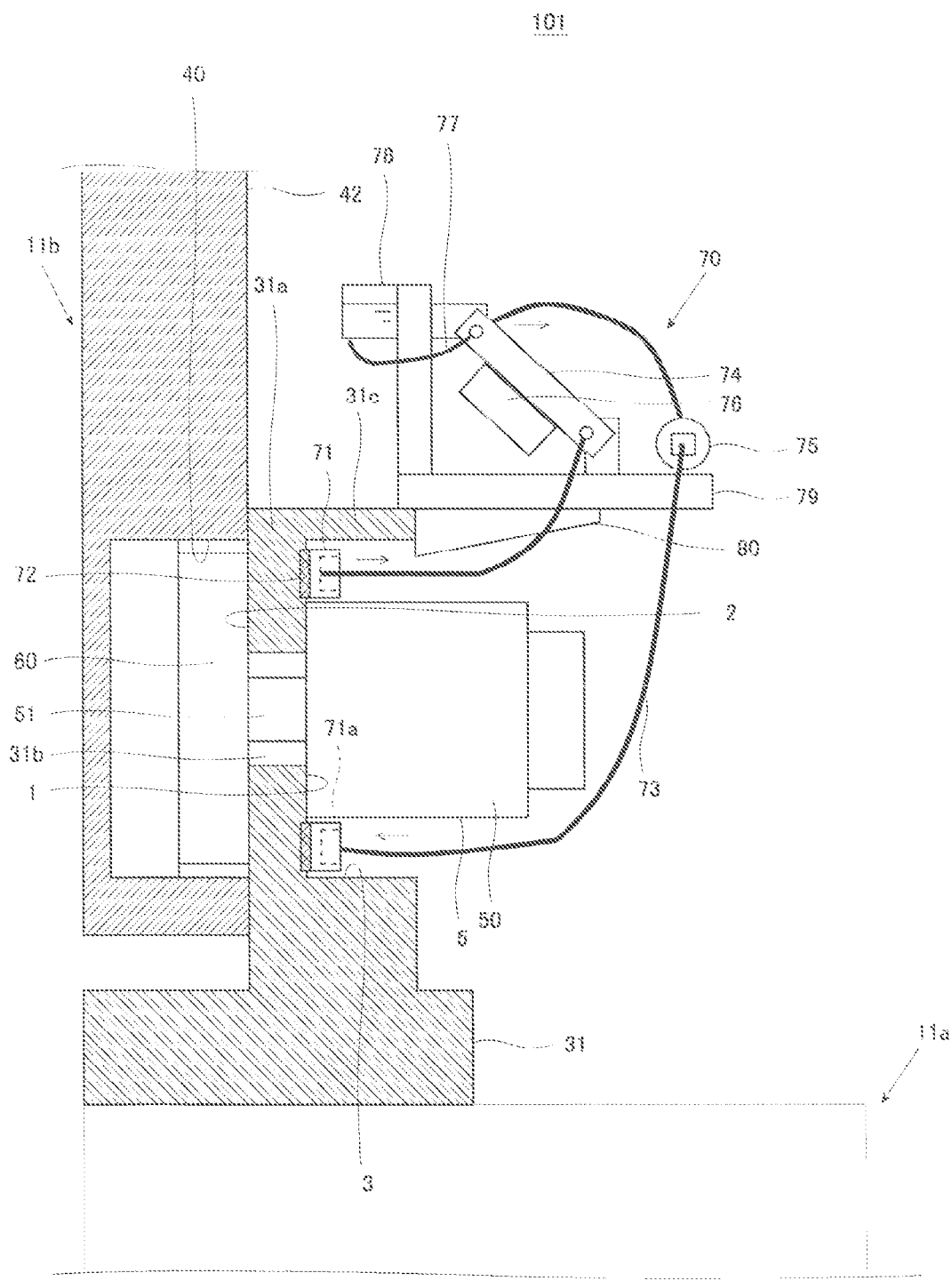
FIG. 5 is a schematic view showing a schematic configuration of a robot of Variant 1 of Embodiment 1.

FIG. 5 is a schematic view showing a schematic configuration of the robot of Variant 1 of Embodiment 1.

As shown in FIG. 5, the robot 101 of Variant 1 has the same basic configuration as the robot system 100 according to Embodiment 1, but differs in that the support base 79 and the flange 80 are mounted on the first link 11a (in particular, the projection 31c).

The robot 101 (cooler 70) of Variant 1 configured as described above offers the same advantages as the robot 101 (cooler 70) according to Embodiment 1.

Embodiment 2

A method of mounting a cooler to a robot according to Embodiment 2 is a method of mounting a cooler for use at a joint of a robot, wherein the joint of the robot includes a first wall constituting an N-th link and a second wall constituting an N+1-th link, a tubular projection extends from a first wall surface of the first wall, the first wall surface facing the N-th link, a motor is located on the first wall surface and inside the projection, a reduction gear is located on a second wall surface of the first wall, the second wall surface facing the N+1-th link, the cooler includes: a cooling medium flow path structure that is annularly or tubularly shaped and that includes an internal cooling medium flow path through which a cooling medium flows; a cooling medium circulation path connected to the cooling medium flow path structure; a radiator; a feeder; a fan; and a support base, the radiator and the feeder are located in the cooling medium circulation path, and the fan cools the radiator with air, the method including: (E) passing the motor through an inner cavity of the cooling medium flow path structure to bring the cooling medium flow path structure into contact with the first wall surface of the first wall; (F) mounting the support base to a main body of the N-th link and/or the motor; (G) mounting the radiator, the feeder, and the fan to the support base; and (H) connecting the cooling medium flow path structure, the radiator, and the feeder to one another through the cooling medium circulation path.

Hereinafter, an example of the method of mounting a cooler to a robot according to Embodiment 2 will be described with reference to FIG. 6. The cooling medium flow path structure, cooler, and robot used in the method according to Embodiment 2 are configured in the same manner as those of Embodiment 1 or Variant 1 and will therefore not be described in detail.

Figure 6:
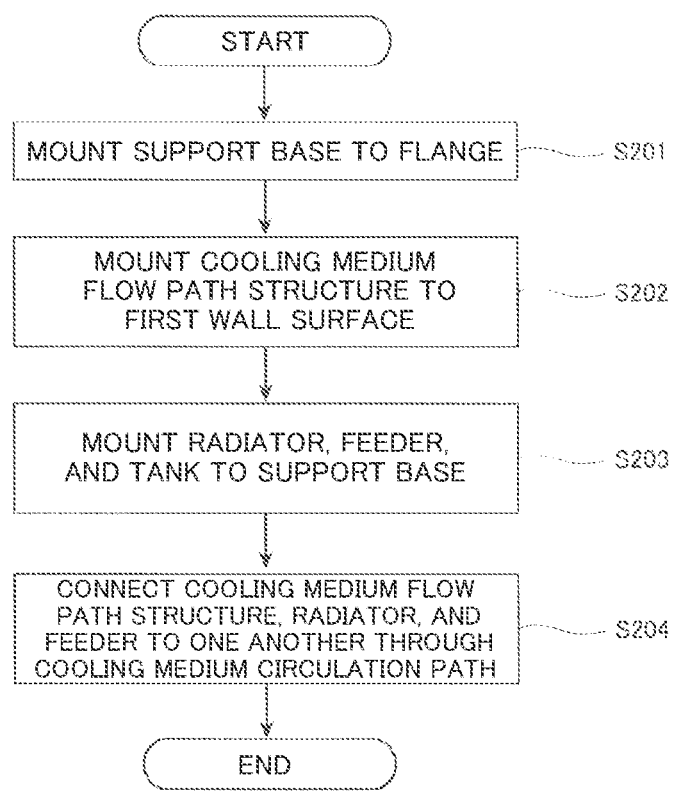
FIG. 6 is a flowchart illustrating a method of mounting a cooler according to Embodiment 2.

FIG. 6 is a flowchart illustrating an example of the method of mounting the cooler according to Embodiment 2.

There is assumed a robot installed in an existing facility and not equipped with the cooler 70 according to Embodiment 2. The following describes the procedures for mounting the cooler 70 to the robot.

As shown in FIG. 6, the worker mounts the support base 79 to the flange 80 (step S201). The worker then mounts the cooling medium flow path structure 71 to the first wall surface 1 of the first wall 31a (step S202). Step S201 and step S202 may be performed in reverse order.

Next, the worker mounts the radiator 74, feeder 75, and tank 78 to the support base 79 (step S203). Subsequently, the worker connects the cooling medium flow path structure 71 (the inlet 71b and outlet 71c of the cooling medium flow path 71a), the radiator 74, and the feeder 75 to one another using pipes constituting the cooling medium circulation path 73 (step S204). The worker then connects the tank 78 and the radiator 74 to each other using pipes constituting the first flow path 77. Finally, the worker charges the tank 78 with the cooling medium, thus completing the mounting of the cooler 70 to the robot 101.

The robot 101 (cooler 70) according to Embodiment 2, which is constructed as described above, offers the same advantages as the robot 101 (cooler 70) according to Embodiment 1.

From the foregoing description, numerous modifications and other embodiments of the present disclosure are obvious to those skilled in the art. Accordingly, the foregoing description is to be construed as illustrative only, and is provided for the purpose of teaching those skilled in the art the best mode for carrying out the present disclosure. The structural and/or functional details may be substantially modified without departing from the scope of the present disclosure.

INDUSTRIAL APPLICABILITY

The cooling medium flow path structure, the cooler, the robot, and the method of mounting a cooler to a robot according to the present disclosure can reduce the burden on the worker and increase the efficiency in cooler mounting work and/or can effect a reduction in manufacturing cost, and are therefore beneficial to the robot industry.

The invention claimed is:

1. A cooler comprising a cooling medium flow path structure for use at a joint of a robot, wherein the robot includes an N-th link, an N+1-th link, and a joint coupling the N-th and N+1-th links together,
   the N-th link includes a plate-shaped first wall,
   the N+1-th link includes a second wall coupled to the first wall,
   a motor is located on and in direct contact with the first wall,
   the cooling medium flow path structure is annularly or tubularly shaped around an open center,
   the cooling medium flow path structure is in contact with the first wall and surrounds a portion of a housing of the motor,
   the portion of the housing of the motor penetrates through the cooling medium flow path structure and into the open center,
   an inner peripheral surface of the cooling medium flow path structure is located outside an outer peripheral surface of the motor,
   the cooling medium flow path structure includes an internal cooling medium flow path through which a cooling medium flows, and
   the cooler further comprises:
      a cooling medium circulation path connected to the cooling medium flow path structure and configured to connect with at least one of a radiator, a feeder, and a fan.

2. The cooler according to claim 1, wherein
   a projection extends from the first wall,
   the motor is located inside the projection, and
   an outer peripheral surface of the cooling medium flow path structure is located inside an inner peripheral surface of the projection.

3. The cooler according to claim 2, wherein the projection is tubular.

4. The cooler according to claim 1, wherein the cooling medium is water or antifreeze.

5. A robot comprising the cooler according to claim 1.

6. The robot according to claim 5, wherein
   the robot is a multi-axis vertical robot including joints,
   an axle of one of the joints that is closest to a proximal end of the robot is a first axle, and
   the cooler is located on at least one of the first axle, a second axle, and a third axle of the robot.

7. The robot according to claim 5, wherein
   the motor is mounted on a first wall surface of the first wall, the first wall surface facing away from the N+1-th link,
   a reduction gear is located on a second wall surface of the first wall, the second wall surface facing the N+1-th link, and
   the cooling medium flow path structure is located on the first wall surface.

8. The robot according to claim 7, wherein a heat-transfer material is located between the cooling medium flow path structure and the first wall surface.

9. The robot according to claim 5, wherein the cooling medium circulation path is located in the N-th link.

10. The cooler according to claim 1, wherein the cooling medium flow path structure is detachable from the first wall without detaching the motor.

11. The cooler according to claim 1, wherein the plate-shaped first wall is a unitary piece.

12. A method of mounting a cooler for use at a joint of a robot, wherein
   the robot includes an N-th link, an N+1-th link, and a joint coupling the N-th and N+1-th links together,
   the N-th link includes a plate-shaped first wall,
   the N+1-th link includes a second wall coupled to the first wall,
   a tubular projection extends from a first wall surface of the first wall, the first wall surface facing away from the N+1-th link,
   a motor is located on the first wall surface in direct contact with the first wall surface and inside the projection,
   a reduction gear is located on a second wall surface of the first wall, the second wall surface facing the N+1-th link,
   the cooler includes: a cooling medium flow path structure that is annularly or tubularly shaped around an open center and includes an internal cooling medium flow path through which a cooling medium flows; a cooling medium circulation path connected to the cooling medium flow path structure; a radiator; a feeder; a fan; and a support base,
   the radiator and the feeder are located in the cooling medium circulation path, and
   the fan cools the radiator with air,
   the method comprising:
   mounting the radiator, the feeder, and the fan to the support base;
   passing a portion of a housing of the motor through the open center of the cooling medium flow path structure to bring the cooling medium flow path structure into contact with the first wall surface of the first wall so that the portion of the housing of the motor penetrates through the open center of the cooling medium flow path structure and the cooling medium flow path structure surrounds the portion of the housing of the motor;
   mounting the support base with the radiator, the feeder, and the fan to a main body of the N-th link and/or the motor; and
   connecting the cooling medium flow path structure, the radiator, and the feeder to one another through the cooling medium circulation path.

13. A method of mounting a cooler for use at a joint of a robot, wherein
   the robot includes an N-th link, an N+1-th link, and a joint coupling the N-th and N+1-th links together,
   the N-th link includes a plate-shaped first wall,
   the N+1-th link includes a second wall coupled to the first wall,
   a tubular projection extends from a first wall surface of the first wall, the first wall surface facing away from the N+1-th link,
   a motor is located on the first wall surface in direct contact with the first wall surface and inside the projection,
   a reduction gear is located on a second wall surface of the first wall, the second wall surface facing the N+1-th link,
   the cooler includes: a cooling medium flow path structure that is annularly or tubularly shaped around an open center and includes an internal cooling medium flow path through which a cooling medium flows; a cooling medium circulation path connected to the cooling medium flow path structure; a radiator; a feeder; a fan; and a support base, the radiator and the feeder are located in the cooling medium circulation path, and the fan cools the radiator with air, the method comprising:

passing a portion of a housing of the motor through the open center of the cooling medium flow path structure to bring the cooling medium flow path structure into contact with the first wall surface of the first wall so that the portion of the housing of the motor penetrates through the open center of the cooling medium flow path structure and the cooling medium flow path structure surrounds the portion of the housing of the motor;

mounting the support base to a main body of the N-th link and/or the motor;

mounting the radiator, the feeder, and the fan to the support base; and connecting the cooling medium flow path structure, the radiator, and the feeder to one another through the cooling medium circulation path.

* * * * *